(12) United States Patent
Rorick

(10) Patent No.: US 8,335,131 B2
(45) Date of Patent: Dec. 18, 2012

(54) ACOUSTIC TRANSDUCER ARRAY ELEMENT HAVING A PLURALITY OF ACOUSTICALLY COUPLED TRANSDUCER ASSEMBLIES

(75) Inventor: Timothy P. Rorick, New Haven, IN (US)

(73) Assignee: Undersea Sensor Systems, Inc., Columbia City, IN (US)

( * ) Notice: Subject to any disclaimer, the term of this patent is extended or adjusted under 35 U.S.C. 154(b) by 673 days.

(21) Appl. No.: 11/529,688

(22) Filed: Sep. 29, 2006

(65) Prior Publication Data

US 2008/0079332 A1    Apr. 3, 2008

(51) Int. Cl.
*G10K 11/00* (2006.01)
(52) U.S. Cl. ............... 367/155; 367/153; 310/321
(58) Field of Classification Search .............. 367/153, 367/155, 154
See application file for complete search history.

(56) References Cited

U.S. PATENT DOCUMENTS

| 3,952,216 | A | * | 4/1976 | Madison et al. | 367/155 |
| 3,986,159 | A | | 10/1976 | Horn | |
| 4,542,356 | A | * | 9/1985 | Nakazawa et al. | 333/195 |
| 4,546,459 | A | * | 10/1985 | Congdon | 367/155 |
| 4,656,616 | A | * | 4/1987 | Bennett et al. | 367/153 |
| 7,054,229 | B2 | * | 5/2006 | Kitchin et al. | 367/130 |
| 2007/0070816 | A1 | * | 3/2007 | Hurst et al. | 367/159 |

OTHER PUBLICATIONS

International Search Report.

* cited by examiner

*Primary Examiner* — Ian Lobo
(74) *Attorney, Agent, or Firm* — Crowell & Moring LLP

(57) ABSTRACT

An acoustic transducer array element includes a plurality of individual or transducer assemblies or "drivers" which are combined in a closely spaced geometry to form the array element. The respective transducer assemblies within each array element are acoustically coupled with each other. The invention utilizes such mutual coupling between the closely spaced transducers assemblies to provide improved acoustic performance.

23 Claims, 10 Drawing Sheets

INCHES

ACOUSTIC TRANSDUCER ARRAY ELEMENT HAVING A PLURALITY OF ACOUSTICALLY COUPLED TRANSDUCER ASSEMBLIES

The present invention is directed to a transducer array element of the type which is used, for example, in a transducer array for a sonar system, as well as to a transducer array incorporating such an element. In particular, the transducer array element according to the invention includes a plurality of individually excitable transducer assemblies.

BACKGROUND OF THE INVENTION

Sonar listening devices, commonly referred to as "sonobuoys", are used to receive and transmit acoustic signals, process the data and communicate via radio frequency link. These devices are either passive (receive acoustic signals), or active (transmit acoustic signals). The basic components of an acoustic transducer array which is used for this purpose are "array elements", each of which includes a transducer in the form of (for example) a piezoelectric ceramic that is electrically excitable to produce a "ping" as an acoustic waveform. The present invention applies to all sonar array configurations, including vertical and horizontal linear arrays, planar arrays and volumetric arrays, and to all transducer array element design technologies, such as, for example, flexural disc transducers.

An acoustic array for underwater applications generally includes a series of individual array elements at a predetermined spacing (typically on the order of 0.5 wavelengths) relative to each other. (See, for example, FIG. 15.) The acoustic performance of the array is determined by the acoustic response characteristics of the individual array elements and their relative spacing. Typically, the array resonant frequency is equal to the resonant frequency of the individual array elements, and the maximum radiated acoustic source level (that is, the sound pressure level) $SPL_{array}$ of an acoustic array is equal to the summation of the maximum array element acoustic source level $SPL_{array\ element}$ plus the directivity index (DI) associated with the spatial arrangement of the array elements in the array. That is, for an array of omni directional elements:

$$SPL_{array} = SPL_{array\ element} + 10*LOG_{10}(\text{number of array elements}) + DI_{array}$$

For maximum sonar performance it is desirable to maximize the amount of acoustic power generated from a given package volume. In addition, for sonar applications, lower frequencies are desirable because they have lower absorption losses and enhanced detection characteristics. The need for continued improvement of sonar performance at lower frequencies, together with a further requirement for an elevated maximum source level, typically mandates larger package sizes. In current high power, shallow water applications the maximum source level of an array element/array is limited by the onset of cavitation on the projector face. The cavitation threshold of a transducer is a well studied phenomena and is related to many factors. For a given transducer design/technology, the hydrostatic pressure on the face of transducer (operational depth) will determine the cavitation limited source level of the transducer. Increasing the depth of operation will increase the cavitation limited source level of the transducer.

The resonant frequency of a transducer is related to the stiffness and mass of the transducer as follows:

$$Fr=(K/M)^{1/2}$$

Where
 Fr=resonant frequency for the transducer
 K=stiffness of the transducer
 M=mass of the transducer In order to accommodate lower frequency requirements (that is, by reducing the resonant frequency of the array element/array), current practice is to decrease the stiffness of the transducer or to increase its mass. Reducing the stiffness is readily accomplished by increasing the size of the radiating element. Increasing the mass of the transducer can be done by various means but most common is the use of dense materials or the attachment of "added mass" to the radiating face of the transducer. However, all of these methods for reducing the resonant frequency of the transducer come at the expense of reduced transducer performance. The reduced stiffness will result in an increased package size and a transducer with decreased hydrostatic load capability. The increased mass reduces the Q factor of the system and results in reduced peak efficiency.

Accordingly, one object of the invention is to provide an acoustic transducer array and array element of the type described above, which achieves improved acoustic performance.

Another object of the invention is to provide such an acoustic transducer array and array element which can be operated with improved efficiency at a lower frequency, over a broader bandwidth, at higher source levels.

These and other objects and advantages are achieved by the acoustic transducer array and array element according to the invention, in which each transducer array element includes a plurality of individual transducer assemblies or "drivers" which are combined in a closely spaced geometry to form the array element. The respective transducer assemblies within each transducer array element are acoustically coupled with each other. The invention utilizes such mutual coupling between the closely spaced transducer assemblies to provide improved acoustic performance.

While the invention was verified with a flexural disc transducer technology, it is applicable to all transducer technologies. By spatially locating the transducer assemblies close to each other within each array element, the resultant array performance can be improved. That is, when two transducer assemblies that have individual resonant frequencies of Fr are spatially located in close proximity to each other (so that they are acoustically linked), the resultant resonant frequency of the new element will be on the order of 0.8*Fr. The invention thus achieves a desirable reduction in operational frequency, without reducing the stiffness or increasing the mass of the array elements, thereby avoiding the disadvantages associated with the prior art solutions referred to previously.

In addition, the invention also provides the following advances over the prior art single driver array elements:

Increased source level. With current transducer technologies, shallow water cavitation limited source levels are limited by the hydrostatic pressure (depth of operation) and the peak velocities that are reached on the surface of the projector face. This invention allows the array elements to be driven harder prior to the onset of cavitation. The internal mutual acoustic coupling preloads the face of the driver elements and allows the transducer to operate at increased source level when deployed in shallow water conditions.

Increased bandwidth. Current bandwidths of many transducer technologies are limited to the mechanical properties of the materials used to construct the transducer and the loading effects of the medium in which they operate. For instance, the Q factor of the transducer operating in air is much higher than the Q factor of the transducer operating in water. Additionally, the Q factor of a transducer built with materials with high internal damping characteristics is lower than a transducer built with standard materials. Known low Q factor, high bandwidth transducers typically possess low efficiencies since significant energy is dissipated in the damping materials. The present invention decreases the Q factor of the system without decreasing the overall efficiency of the transducer. The decreased Q factor results in a wider 3 dB bandwidth; it thus achieves easier electronic tuning of the transducer and facilitates operation with complex waveforms.

Decreased resonant frequency. Decreasing the resonant frequency of conventional transducers is currently accomplished by utilized larger projector surfaces, increasing the mass of the projector or decreasing the stiffness of the projector. These all have negative effects on the performance of the transducer. This invention decreases the effective resonant frequency of a given transducer element while maintaining the mechanical mass and stiffness of the individual driver design. This allows the transducer designer several options for a given design space. Resonant frequencies on the order of 20% allow the transducer designer to maintain mechanical integrity while achieving lower resonant frequencies. This reduces the mechanical stresses inherent in the operation of the transducer, which leads to high drive levels and deeper depth applications in non pressure compensated systems.

Increased depth applications. Current transducer depth limitations are directly related to the effects of hydrostatic pressure. In order to reach a target frequency in a given package size the transducer designer quite often sacrifices mechanical stiffness (and load carrying capability) for reduction in resonant frequency. This reduction in stiffness to meet the resonant frequency requirements reduces the ability of the transducer to withstand the effects of hydrostatic pressure, thereby decreasing its operational depth capability. This invention allows for reduced resonant frequency without sacrificing any mechanical integrity. For a given package space a stronger transducer with an equivalent resonant frequency can be realized. This stronger transducer has increased mechanical strength and is capable of withstanding higher hydrostatic pressure loads.

Other objects, advantages and novel features of the present invention will become apparent from the following detailed description of the invention when considered in conjunction with the accompanying drawings.

DETAILED DESCRIPTION OF THE DRAWINGS

Figure 1:
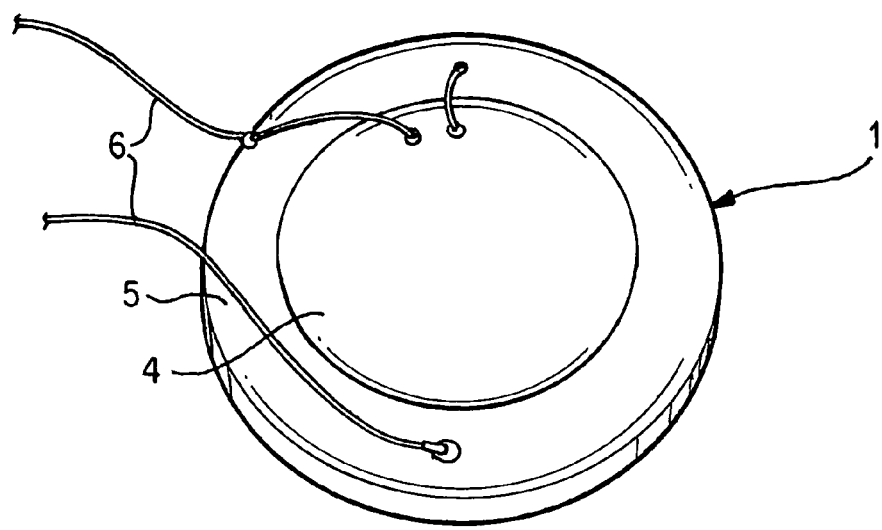
FIG. 1 is a perspective view of a known configuration for a transducer array element according to the prior art.
Figure 2:
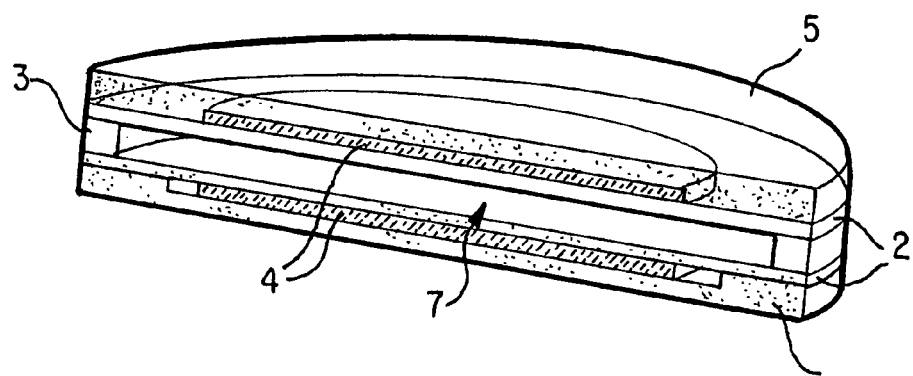
FIG. 2 is a sectional perspective view of the array element of FIG. 1.

A typical bilaminar flexural disc transducer according to the prior art illustrated in FIGS. 1 and 2, includes a projector plate 2, a support ring 3, a piezoelectric ceramic element 4 and potting (or elastomeric) material 5. The respective projector plates 2 and the support ring 3 combine to enclose a cavity 7. The piezoelectric element 4 is energizable via electric lead lines 6, to produce an acoustic vibration or "ping", as described previously.

Figure 3:
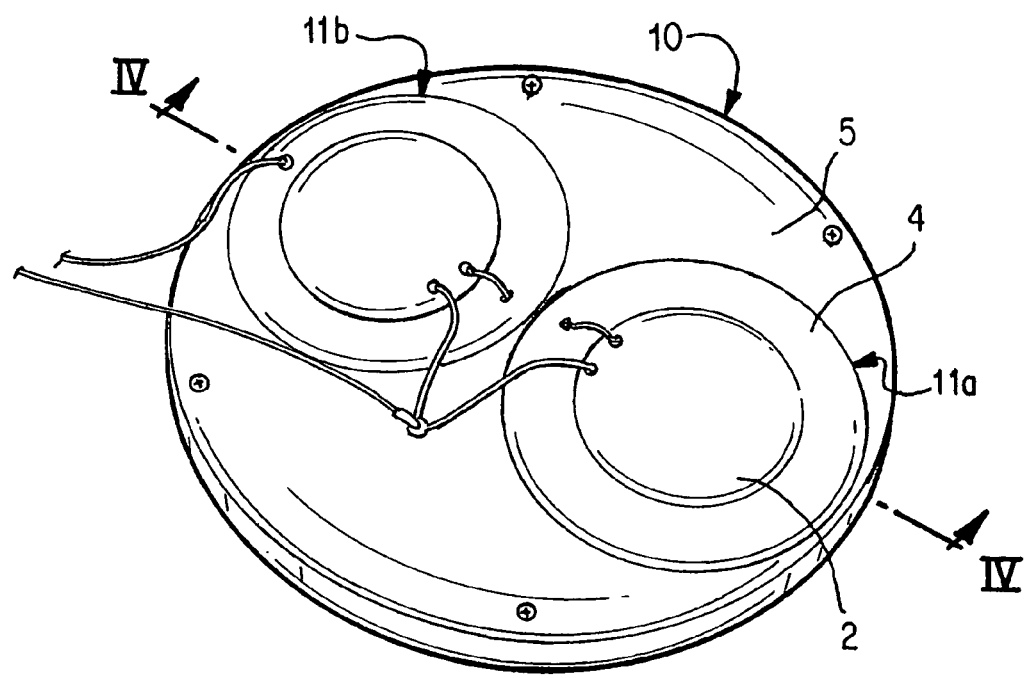
FIG. 3 is a perspective view of a first embodiment of the transducer array element according to the invention, which includes two individual transducer assemblies.
Figure 4:
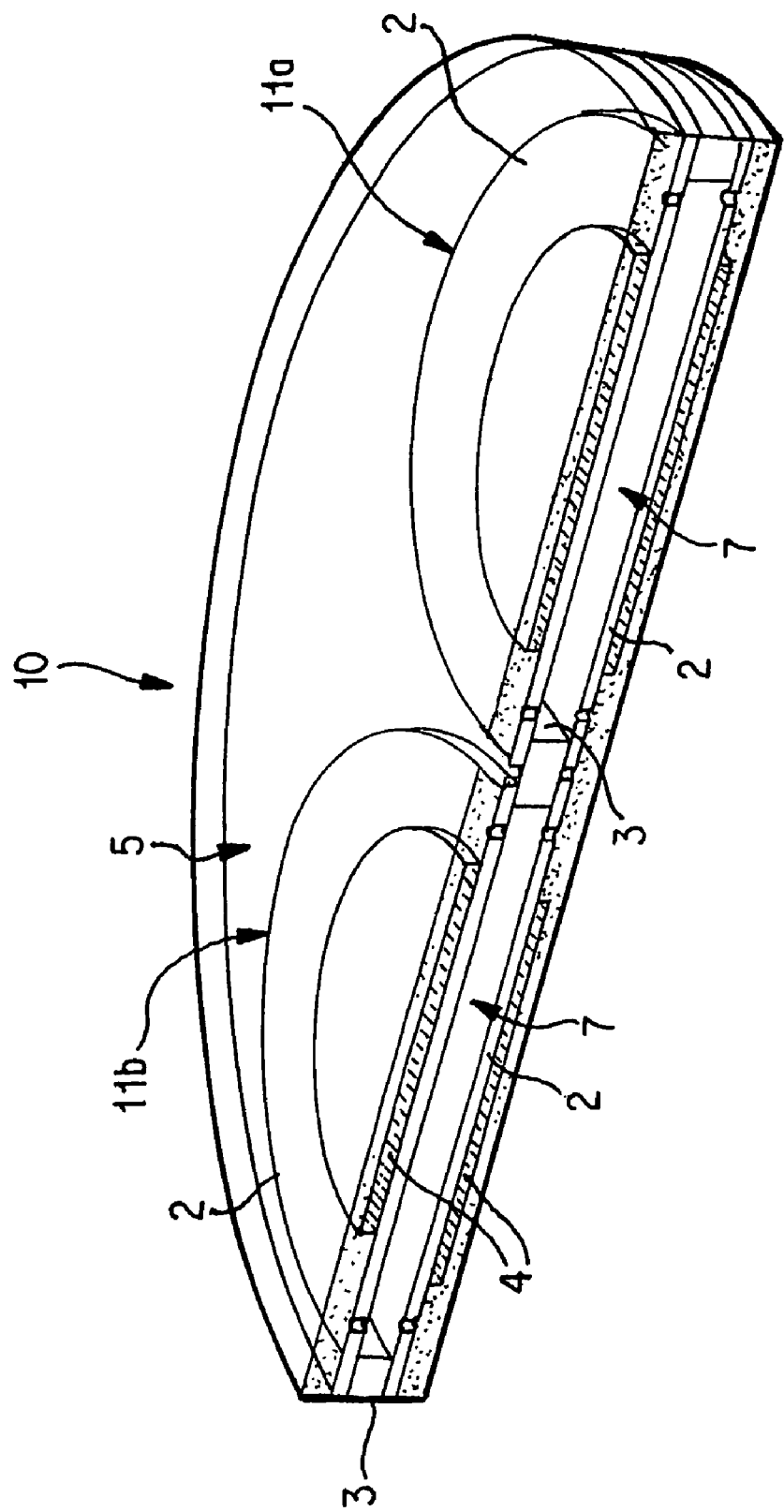
FIG. 4 is a sectional perspective view of the transducer array element of FIG. 3, taken along line IV-IV.
Figure 5:
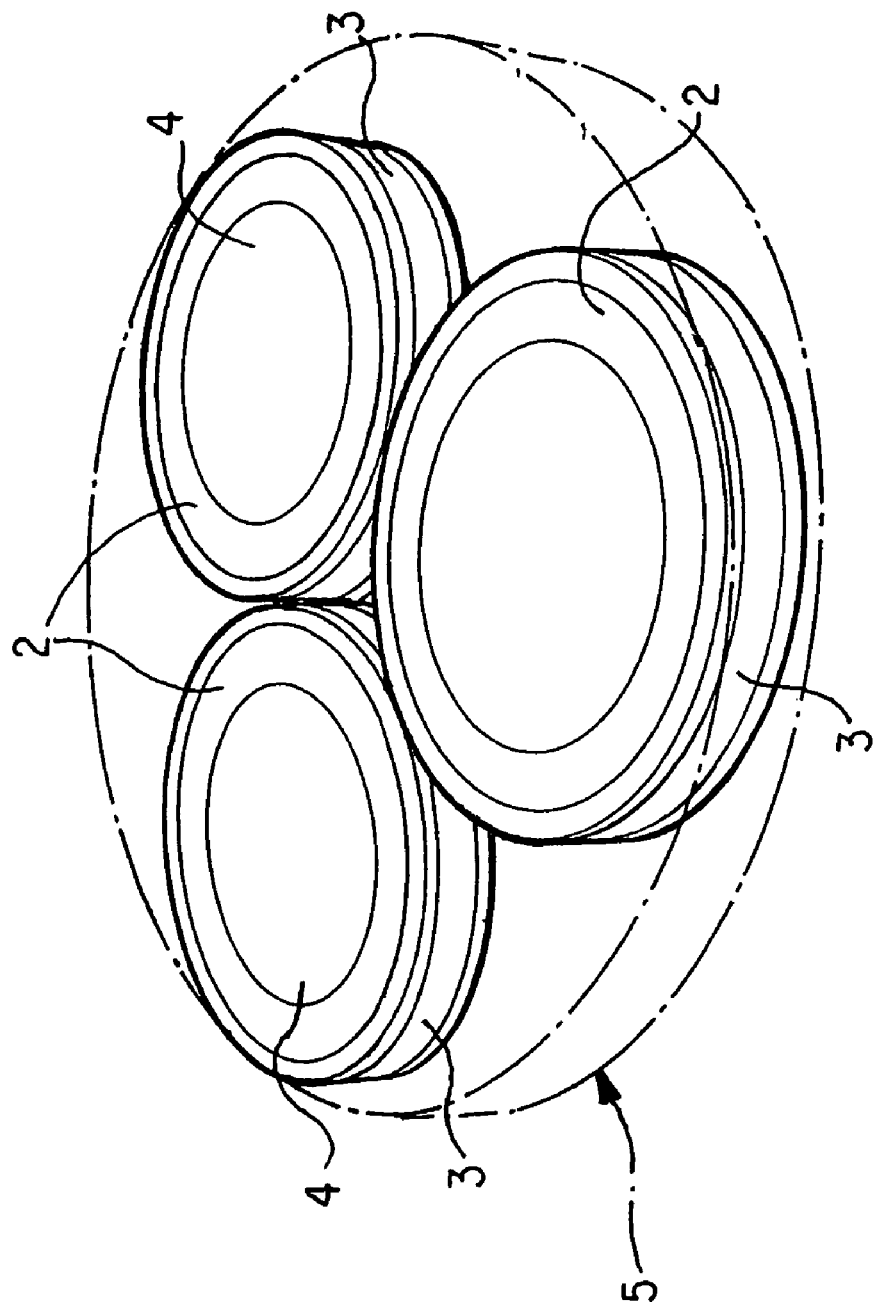
FIGS. 5 through 8 are perspective views of further embodiments of the invention with three, four and five individual transducer assemblies, respectively.

FIG. 3 shows a first embodiment of the acoustic transducer array element 10 according to the invention, which includes two individual drivers or transducer assemblies 11a, 11b which are disposed laterally adjacent and in close proximity to each other to form a single unit that is encased in potting material 5. As shown in FIG. 4, each of the individual transducer assemblies 11a, 11b is constructed in the same general manner illustrated in FIG. 2, using the same piezoelectric ceramic layer 4 and projector plate 2 as is utilized in the single driver prior art device in FIGS. 1 and 2. The inside diameter and height of the support rings 3 (FIGS. 4 and 5) used to support the projector plates 2 (and forming cavities 7) may be the same as that of the single driver device. In the embodiment illustrated in FIG. 4, the support "rings" 3 are provided in the form of circular holes (seen as cavities 7 in FIG. 4) in a single circular plate, which is covered over with potting material 5 on both its top and bottom sides, thereby encasing the respective transducer assemblies 11a and 11b to form the overall transducer array element. Alternatively, separate support rings, essentially identical to those in FIG. 2, may be used to form the respective transducer elements, which are then potted together, as shown in FIG. 5.

Figure 6:
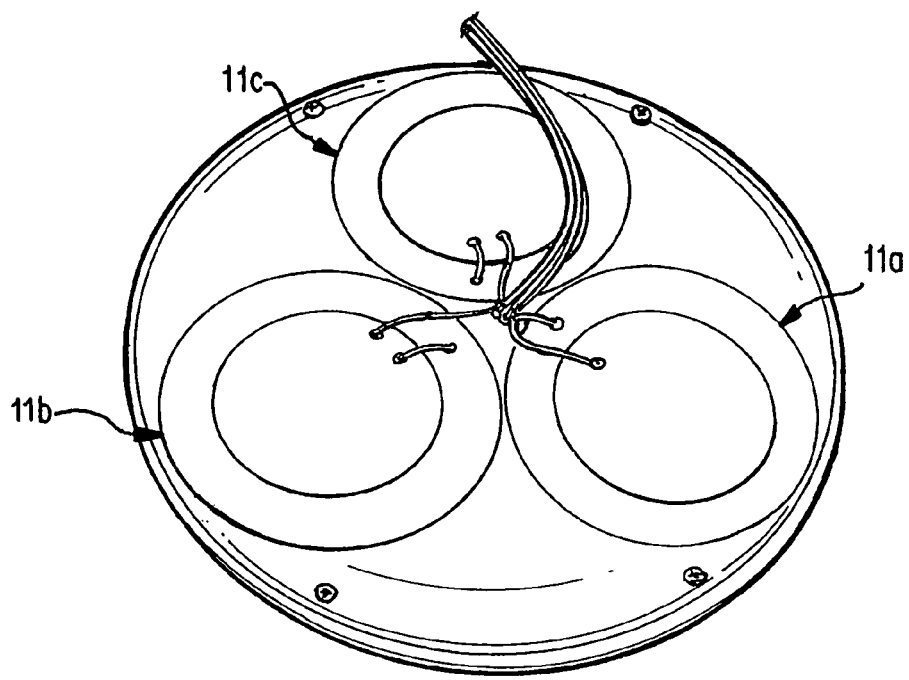
Figure 7:
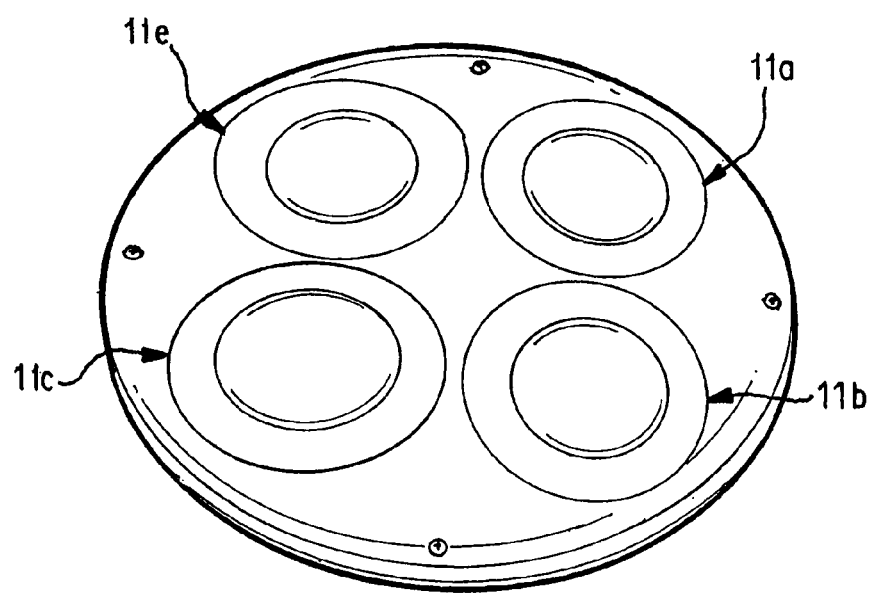
Figure 8:
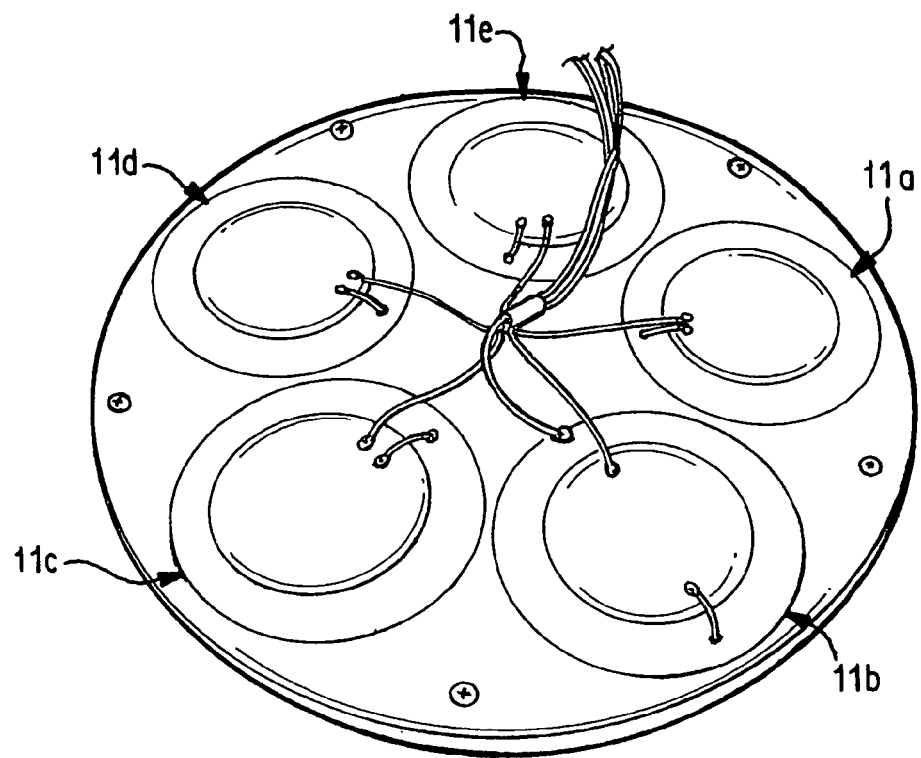

FIGS. 6 through 8 illustrate further embodiments of the invention, which are of similar construction to that of FIG. 3, but having three, four and five individual transducer assemblies 11a-11e, respectively. In each of the embodiments in FIGS. 3-8, the individual transducer assemblies are configured in the same general manner as that of FIGS. 1 and 2, and are disposed in sufficiently close proximity that they are acoustically coupled to each other. As a result, the resonant frequency of the combined unit (that is, an array element) is less than that of the individual transducer assemblies.

Figure 9:
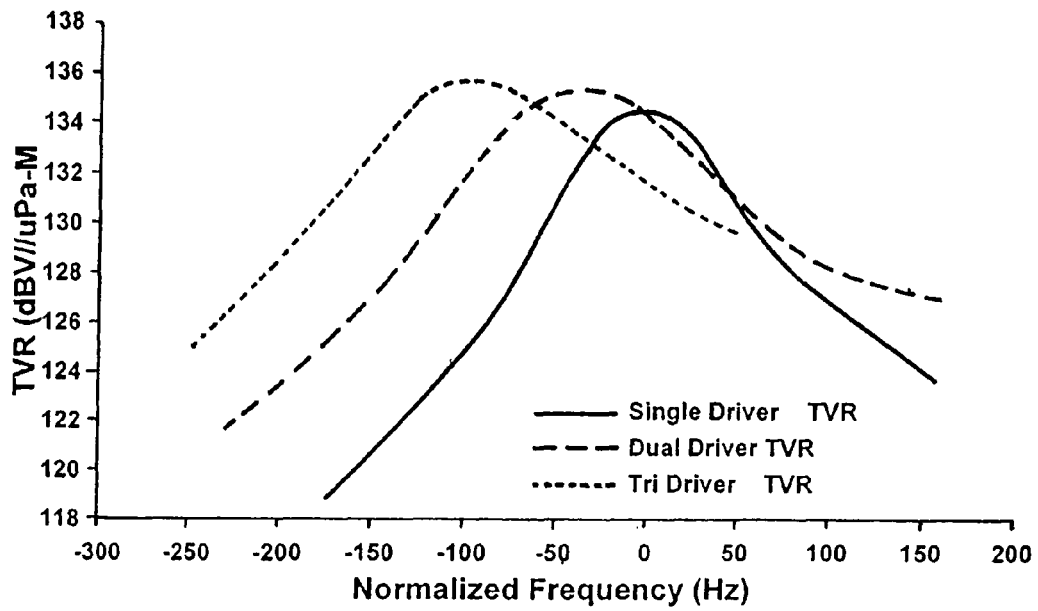
FIG. 9 is a graphic representation of the Transmit Voltage Response of the transducer array elements of FIGS. 1, 3, and 5/6, respectively.

The Transmit Voltage Response (TVR) of the single driver (prior art FIG. 1), dual driver (FIG. 3) and tri driver (FIGS. 5 and 6) array elements are illustrated in FIG. 9, with the normalized resonant frequency Fo of the single driver array element set to 0 Hz. The dual driver array element has a resonant frequency of Fo-35 Hz (that is, 35 Hz less than that of the single driver array), while the tri driver array element has a resonant frequency of Fo-95 Hz. In addition to the reduction in resonant frequency for the same projector element design, the invention also results in increased bandwidth of the transducer. The Q factor for the single driver array element is 10.5, the Q factor of the dual driver element is 7.6 and the Q factor of tri driver array element is reduced to 6.5.

The invention also increases the cavitation limited source level of the basic transducer design. Moreover, locating the individual "drivers" in close proximity to each other also increases the shallow water cavitation limited source level of the array element. Cavitation limited source levels are highly dependent on the depth and environmental conditions of the water in which the transducer is evaluated. For this invention, cavitation limited source level increases on the order of 2.5 dB were recognized for closely spaced elements. This increased source level is due to the mutual coupling interactions loading the face of adjacent drivers, which increases the drive level at which the onset of cavitation occurs. The mutual coupling effectively increases the near field pressure on the face of the transducer and allows it to be driven at a higher driver level.

Figure 10:
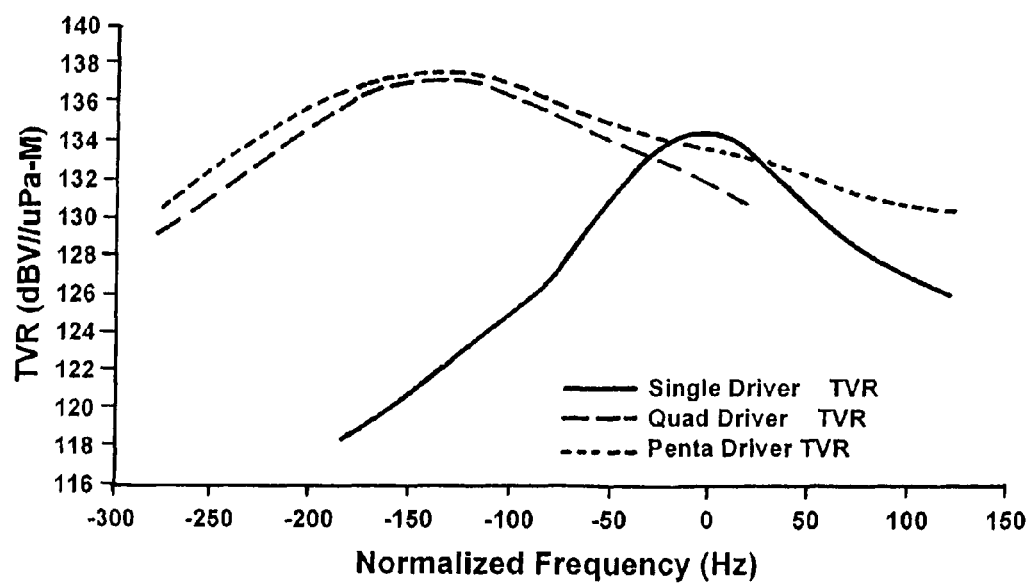
FIG. 10 is a graphic representation of the Transmit Voltage Response of the transducer array elements of FIGS. 1, 7 and 8, respectively.

FIG. 10 illustrates the TVR data for the single driver (prior art, FIG. 1), quad driver (FIG. 7) and penta driver (FIG. 8) array elements, respectively. As can be seen, reductions in the resonant frequency on the order of 150 Hz were observed for the penta configuration. Additionally, the Q factor of the penta driver configuration is reduced to 4.7.

Figure 12:
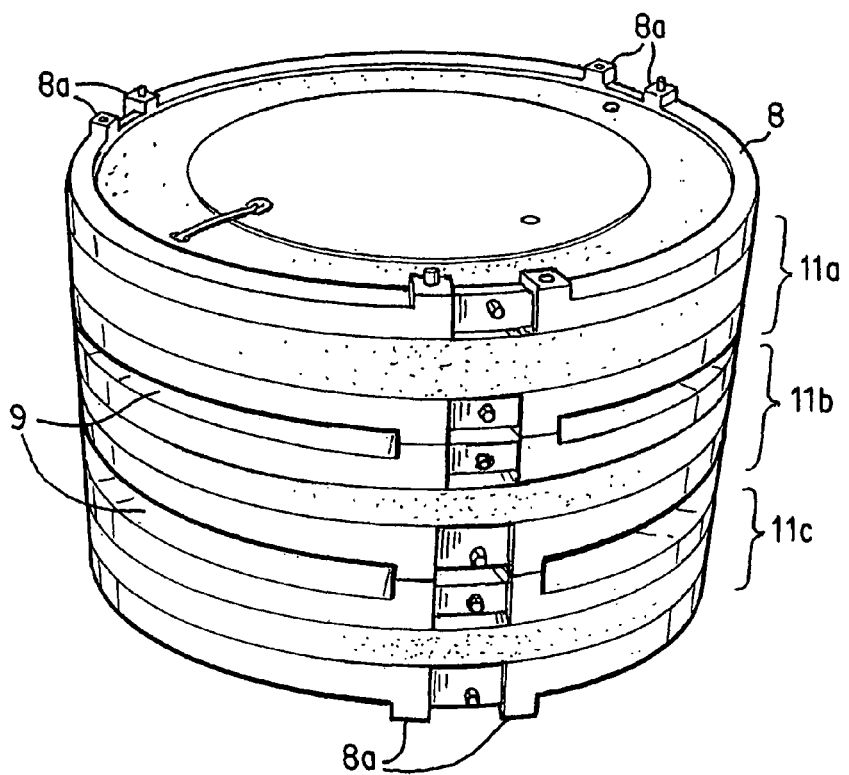
Figure 13:
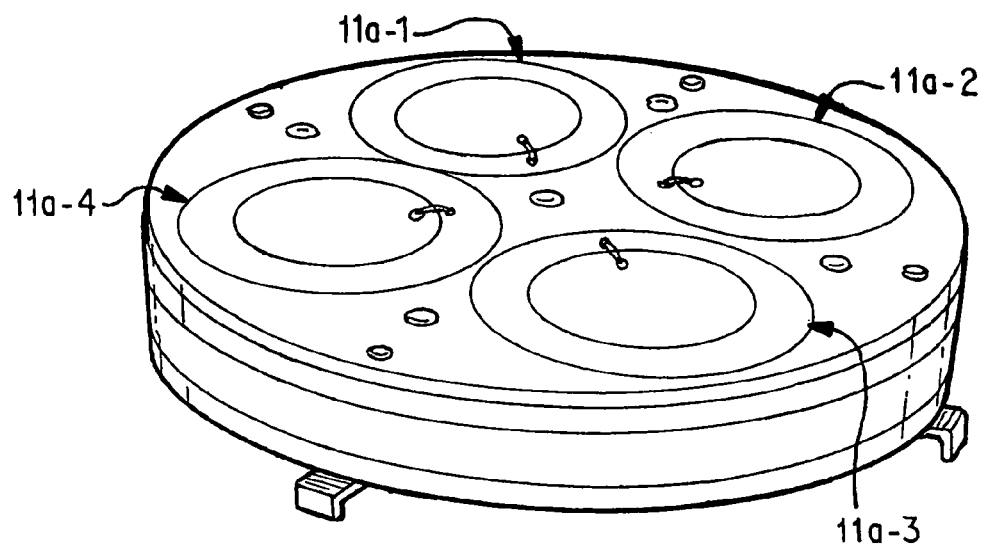

It is important to observe that the invention is not limited to closely spacing the drivers in the horizontal configuration. Rather, it also applies to close spacing of individual drivers in a vertical configuration to construct an array element. Thus, vertically stacked dual and tri driver array elements are illustrated in FIGS. 11 and 12, while a dual quad driver array element is illustrated in FIG. 13 (in which only the upper drivers 11a-1, 11a-2, 11a-3 and 11a-4 are shown).

Figure 11:
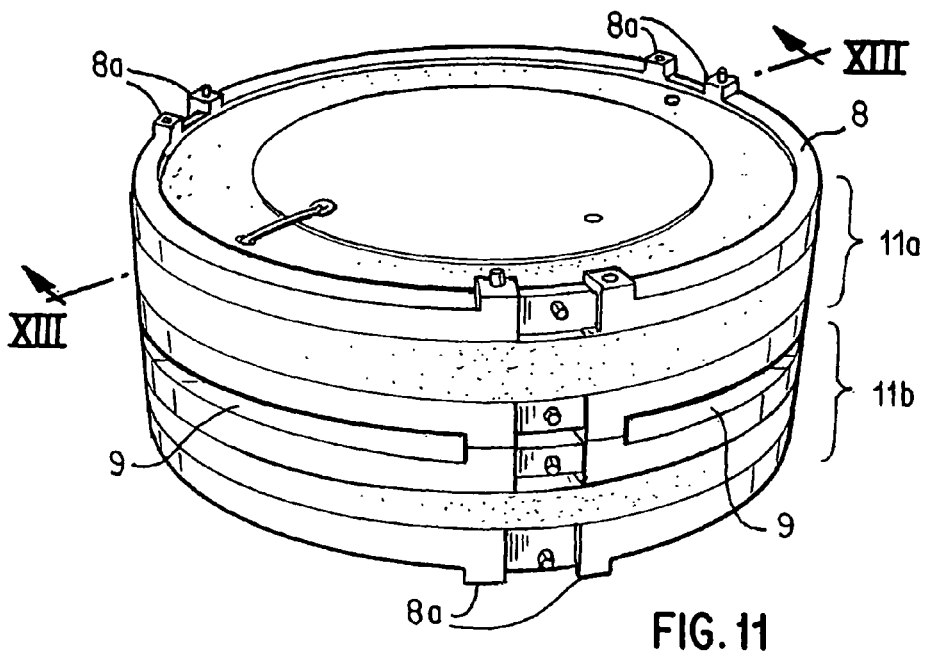
FIGS. 11-13 are perspective views of still further embodiments of the invention.
Figure 14:
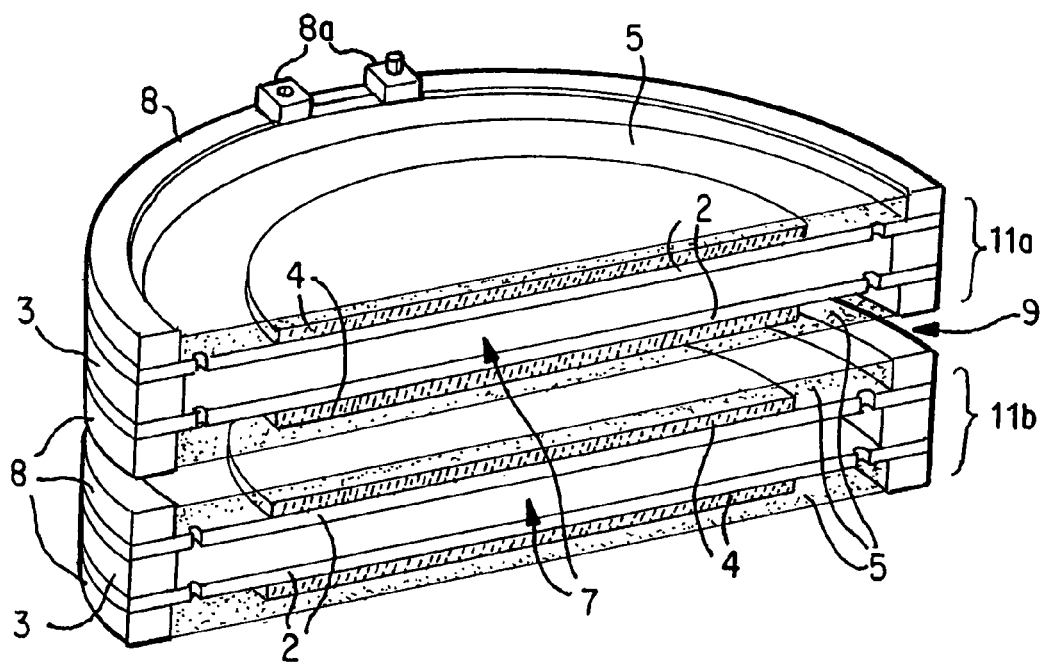
FIG. 14 is a sectional perspective view of the embodiment of FIG. 11, taken along line XIII-XIII.

FIG. 14 is a sectional perspective view of the dual driver stacked array element in FIG. 11. As can be seen, the two individual drivers or transducer assemblies 11a, 11b have the same structure as those shown in FIGS. 3-5, only instead of being potted laterally adjacent each other, they are stacked one above the other. As in the other embodiments, each transducer assembly 11a, 11b comprises piezoelectric ceramic layers or disks 4 applied to projector plates 2, which are spaced apart by support rings 3 forming closed cavities 7, and are encased in potting material 5. Respective circular frame members 8 are disposed at the upper and lower periphery of each transducer assembly, and serve to contain the potting material and to clamp the individual transducer assemblies together. Each transducer unit is held at a fixed separation from the other by mechanical fixturing that can be included in the transducer design. For example, in FIGS. 11, 12, and 14, the circular frame members have upward and downward projections 8 which can be mated together as shown, thereby separating the respective drivers (transducer assemblies) and forming intervening spaces 9.

Whether the drivers are located in a vertical or horizontal or both orientations, the results of this invention apply. The composite array elements will all have enhanced acoustic performance.

Figure 15:
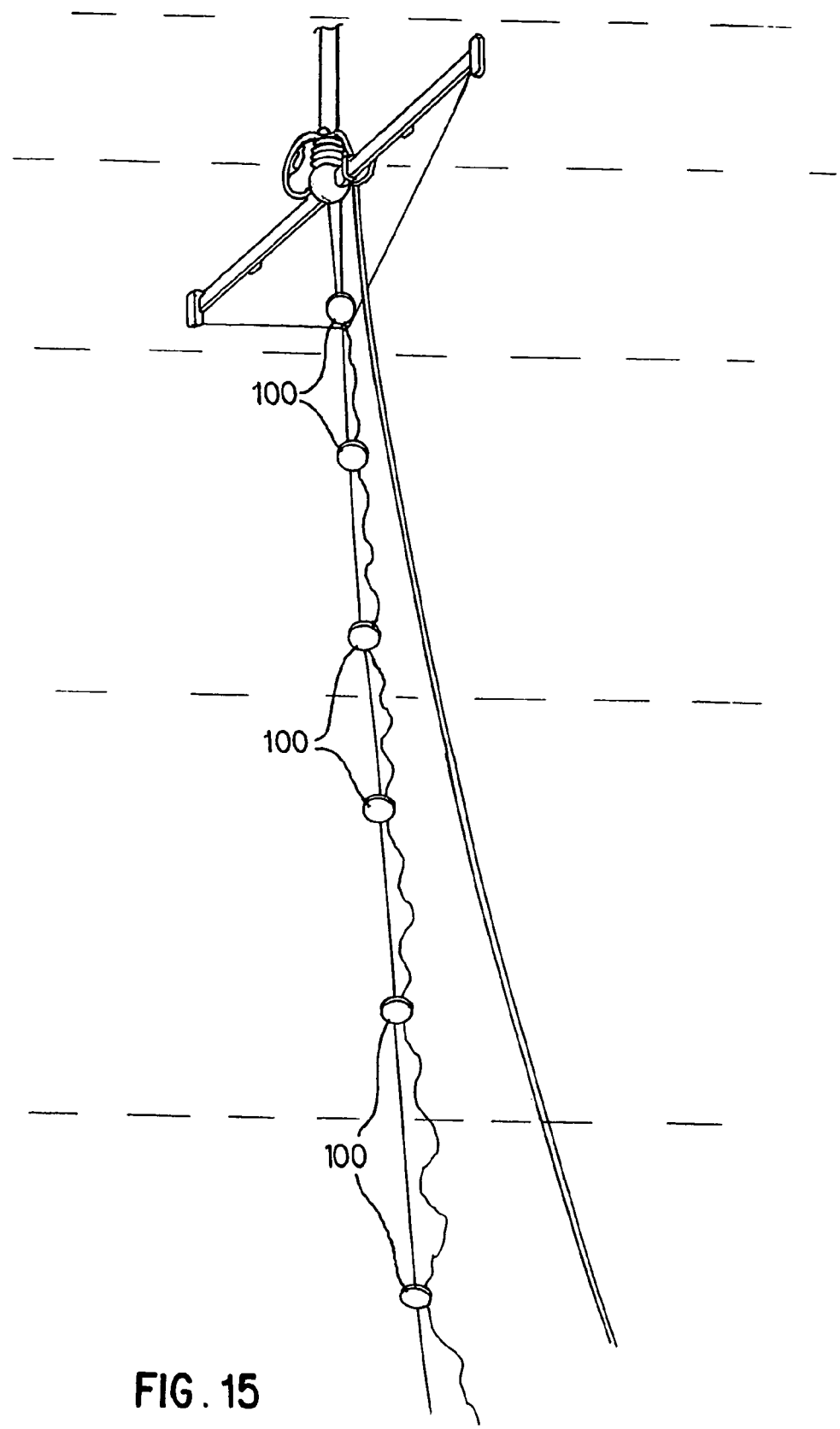
FIG. 15 illustrates a deployed acoustic transducer array according to the invention.

Finally, FIG. 15 is a view which shows a plurality of transducer elements 100 according to the invention, incorporated in an acoustic sensor array that is deployed in an ocean environment.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An acoustic transducer array, comprising:
   a plurality of transducer array elements disposed according to a predetermined geometric pattern, at a predetermined spacing relative to each other; wherein,
   each of said transducer array elements emits acoustic energy into a surrounding environment in response to oscillations introduced by a driver arrangement disposed therein;
   each driver arrangement comprises a plurality of separately excited individual transducer assemblies; and
   within each driver arrangement, each of said individual transducer assemblies has substantially the same resonant frequency;
   within each driver arrangement said transducer assemblies are spaced in such close physical proximity to each other that they are mutually acoustically coupled with each other, and such that a resonant frequency of the transducer array element is lower than the resonant frequency of the individual transducer assemblies.

2. The acoustic transducer array according to claim 1, wherein the resonant frequency of the transducer array element is approximately equal to 0.8 times the resonant frequency of the individual transducer assemblies.

3. The acoustic transducer array according to claim 1, wherein each of said individual transducer assemblies comprises:
   at least one projector plate mounted on a supporting ring; and
   an excitation element mounted on each of said at least one projector plate.

4. The acoustic transducer array according to claim 1, wherein said individual transducer assemblies are disposed substantially in a common plane and are mounted together to form a single transducer array element.

5. The acoustic transducer array according to claim 4, wherein:
   the supporting rings of the respective transducer assemblies are formed by respective laterally adjacent holes formed in a single circular plate; and
   opposite sides of said plate are covered over with an elastomeric material to form said transducer array element.

6. The acoustic transducer array according to claim 4, wherein:
   the supporting rings of the respective transducer assemblies are formed separately and encased laterally adjacent to one another, in an elastomeric material.

7. The acoustic transducer array according to claim 1, wherein said individual transducer assemblies are stacked together to form a single transducer arrangement.

8. The acoustic transducer array according to claim 1, wherein said acoustic transducer array is configured as one of a vertical line array, a horizontal line array, a planar array and a volumetric array.

9. An acoustic transducer array element comprising:
   a plurality of individual transducer assemblies which are mounted together, and which have substantially the same resonant frequency; wherein,
   said individual transducer assemblies are mutually acoustically coupled with each other; and
   a degree of acoustic coupling of said individual transducer assemblies is such that a resonant frequency of said transducer array element is lower than a resonant frequency of the individual transducer assemblies.

10. The acoustic transducer array element according to claim 9, wherein the resonant frequency of the transducer array element is approximately equal to 0.8 times the resonant frequency of the individual transducer assemblies.

11. The acoustic transducer array element according to claim 9, wherein each of said individual transducer assemblies comprises:
   at least one projector plate mounted on a supporting ring;
   an excitation element mounted on each of said at least one projector plate; and
   elastomeric material surrounding said supporting ring, projector plate and excitation element.

12. The acoustic transducer array element according to claim 9, wherein said individual transducer assemblies are disposed substantially in a common plane and are mounted together to form a single transducer array element.

13. The acoustic transducer array according to claim 12, wherein:
the supporting rings of the respective transducer assemblies are formed by respective laterally adjacent holes formed in a single circular plate; and
opposite sides of said plate are covered over with an elastomeric material to form said transducer array element.

14. The acoustic transducer array according to claim 12, wherein:
the supporting rings of the respective transducer assemblies are formed separately and encased laterally adjacent to one another, in an elastomeric material.

15. The acoustic transducer array element according to claim 9, wherein said individual transducer assemblies are stacked together to form a single transducer arrangement.

16. An acoustic transducer array element comprising:
a driver arrangement which can be excited to generate acoustic vibrations at a first resonant frequency; and
a material for mounting said driver arrangement; wherein,
said driver arrangement comprises a plurality of transducer assemblies which are individually excitable to generate acoustic vibrations, and which have substantially the same resonant frequency; and
said transducer assemblies are situated in such close proximity to each other within said driver arrangement, that they are mutually acoustically coupled with each other, and such that said first resonant frequency is lower than a resonant frequency of the respective transducer assemblies.

17. The acoustic transducer array element according to claim 16, wherein the resonant frequency of the transducer array element is approximately equal to 0.8 times the resonant frequency of the individual transducer assemblies.

18. The acoustic transducer array element according to claim 16, wherein each of said individual transducer assemblies comprises:
at least one projector plate mounted on a supporting ring; and
an excitation element mounted on each of said at least one projector plate.

19. The acoustic transducer array element according to claim 16, wherein said individual transducer assemblies are disposed substantially in a common plane and are mounted together to form a single transducer array element.

20. The acoustic transducer array according to claim 19, wherein:
supporting rings of the respective transducer assemblies are formed by respective laterally adjacent holes formed in a single circular plate; and
opposite sides of said plate are covered over with elastomeric material to form said transducer array element.

21. The acoustic transducer array according to claim 19, wherein:
supporting rings of the respective transducer assemblies are formed separately and encased laterally adjacent to one another, in elastomeric material.

22. The acoustic transducer array element according to claim 16, wherein said individual transducer assemblies are stacked together to form a single transducer arrangement.

23. A method of operating an acoustic transducer array comprising a plurality of transducer array elements which are disposed according to a predetermined geometric pattern, relative to each other, and which have substantially the same resonant frequency, said method comprising:
exciting each transducer array element by a separately energizable individual transducer assembly which is disposed therein; wherein
within each array element, said individual transducer assemblies are situated in close proximity to, and mutually acoustically coupled with, each other; and
a degree of acoustic coupling among said individual transducer assemblies is such that a resonant frequency of said transducer array element is lower than a resonant frequency of the individual transducer assemblies.

* * * * *